United States Patent
Ding

(10) Patent No.: US 7,411,287 B2
(45) Date of Patent: Aug. 12, 2008

(54) STAGGERED WIREBONDING CONFIGURATION

(75) Inventor: Yi-Chuan Ding, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 37 days.

(21) Appl. No.: 11/265,085

(22) Filed: Nov. 3, 2005

(65) Prior Publication Data

US 2006/0097387 A1    May 11, 2006

(30) Foreign Application Priority Data

Nov. 5, 2004    (TW) .............................. 93133828 A

(51) Int. Cl.
    *H01L 23/48*    (2006.01)
(52) U.S. Cl. .................. 257/692; 257/786; 257/723
(58) Field of Classification Search ............... 257/673, 257/692, 786, 723
See application file for complete search history.

(56) References Cited

U.S. PATENT DOCUMENTS

| | | | | |
|---|---|---|---|---|
| 5,420,460 | A * | 5/1995 | Massingill | 257/693 |
| 5,592,020 | A * | 1/1997 | Nakao et al. | 257/666 |
| 6,008,532 | A * | 12/1999 | Carichner | 257/691 |
| 6,538,336 | B1 * | 3/2003 | Secker et al. | 257/786 |
| 6,603,199 | B1 * | 8/2003 | Poddar | 257/691 |
| 6,714,421 | B2 | 3/2004 | Chen et al. | |
| 2006/0091558 | A1 * | 5/2006 | Huang et al. | 257/774 |
| 2006/0267175 | A1 * | 11/2006 | Lee | 257/686 |

* cited by examiner

*Primary Examiner*—Douglas M Menz
(74) *Attorney, Agent, or Firm*—Birch, Stewart, Kolasch & Birch, LLP

(57) ABSTRACT

The present invention discloses a staggered finger configuration comprising a plurality of first and second conducting wires alternately arranged on the substrate, wherein each of the first conducting wire connecting an inner and an outer fingers and each of the second conducting wire connecting an intermediate finger between the inner and the outer fingers, thereby forming a staggered configuration.

20 Claims, 8 Drawing Sheets

STAGGERED WIREBONDING CONFIGURATION

This application claims foreign priority under 35 USC 119 of Taiwan Application Serial No. 093133828, filed May 11, 2004, which is hereby incorporated by reference.

BACKGROUND

The present invention relates in general to a staggered finger configuration and more particularly to a staggered finger configuration for chips with staggered bonding pads.

As the efficiency and complexity of semiconductor chips increase, semiconductor packages provide increased efficiency.

In wire bonding, the arrangement of bonding pads on a chip is important. In a package process such as ball grid array (BGA), the pitch of conductive wires on a substrate can be very small due to photolithography technique. Nevertheless, the pitch of the bonding pads is confined by the design rule of wire bonding process, remaining unable to scale down to match the conductive wires. As a result, the arrangement of bonding pads has become a critical parameter in package efficiency.

Generally, the number and pattern of I/O connections between chips and outer circuits depend on the architecture and functions of a chip. Specifically, chips with more functions require more I/O connections.

Conventional bonding pads are arranged singly in-line and staggered. The single in-line arrangement cannot accommodate increased numbers of bonding pads, but the staggered arrangement can improve above fault, as illustrated in FIG. 1 and FIG. 2.

FIG. 1 is a top view of bonding wire connections between a conventional chip with staggered bonding pads and fingers on a substrate. The bonding wire connection comprises a substrate 120, the upper surface of which bear a chip with staggered bonding pads disposed thereon, a plurality of fingers 126a and 126b and a conductive trace 160. A plurality of bonding pads 122a, 122b acting as I/O pads for signals are arranged alternately on the chip 110. Moreover, the bonding pads 122a and 122b connect fingers 126a and 126b by bonding wires 124a and 124b to electrically connect the conductive trace 160. FIG. 2 is a cross-section of FIG. 1 along line 2-2. A package body 150 is formed to encapsulate the chip 110, bonding wires 124a, 124b and the upper surface of the substrate 120 to complete the package 100.

As shown in FIG. 1, the bonding wire 124a connects the outer bonding pad 122a as a signal pad with the finger 126a closer to the chip 110 to electrically connect the conductive trace 160. The bonding wire 124b connects the inner bonding pad 122b as a signal pad with the finger 126b closer to the chip 110 to electrically connect the conductive trace 160. In this case, the number of bonding pads 122a, 122b exceeds the number of fingers 126a, 126b, such that the finger 126a closer to the chip 110 connects to the outer bonding pad 122a, and the finger 126b farthest from the chip 110 connects to the inner bonding pad 122b. As a result, bonding wires are tiered to retain the loop height of the bonding wire 124a lower than that of the bonding wire 124b to prevent shorts in the wire bonding process.

For reduced cost, a common substrate is currently popular in semiconductor chip packaging. With different arrangements of staggered bonding pads on the chip 110, however, it is necessary to rearrange the fingers on the substrate to prevent shorts in the wire bonding process, with more than one arrangements needed. As shown in FIG. 3, the arrangement of bonding pads 122a', 122b' is opposite to that in FIG. 1, and the finger 126a' closer to the chip 110' connects the inner bonding pad 122a' and the finger 126b' farther from the chip 110 connects the outer bonding pad 122b', making it different from them to be tiered. As a result, bonding wires 124a' and 124b' short easily.

Accordingly, what is needed is a common substrate suitable for a chip with different arrangements of bonding pads to reduce costs and provide more bonding pads on a chip to enhance chip efficiency.

SUMMARY OF THE INVENTION

An object of the invention is to provide a staggered finger configuration and a semiconductor chip package applicable to chips with different arrangements of staggered bonding pads, in order to reduce the cost from additional design of fingers on a substrate, and forming more bonding pads to enhance the chip efficiency.

Accordingly, the invention provides a wafer level packaging method for stacked chips, comprising providing a staggered finger configuration comprising a plurality of first and second conducting wires alternately arranged on a substrate, wherein each of the first conducting wires connects a pair of inner and outer fingers, and each of the second conducting wire connects an intermediate finger between the inner and the outer fingers, forming a staggered configuration.

The invention further provides a semiconductor chip package comprising a substrate having a plurality of first and second conducting wires arranged alternately thereon, wherein each of the first conducting wires connects to a pair of inner and outer fingers, and each of the second conducting wires connects to an intermediate finger between the inner and the outer fingers, forming a staggered configuration, a chip disposed on the substrate with rows of inner and outer bonding pads arranged on the periphery of the chip, a plurality of first and second bonding wires arranged alternately, one end of each connecting to the fingers and the other end of each connecting to the bonding pads, wherein the first bonding wires connect to either one of the inner and the outer fingers, and the second bonding wires connect to the intermediate fingers.

Using the staggered finger configuration and the semiconductor chip package of the invention, only one substrate is needed for chips with staggered bonding pads.

In addition, the staggered bonding pads can replace the conventional single in-line bonding pads to increase the number of the bonding pads on a chip, thereby enhancing the chip efficiency, reducing the cost of the package for chips and improving the package yield for chips.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION

Figure 1:
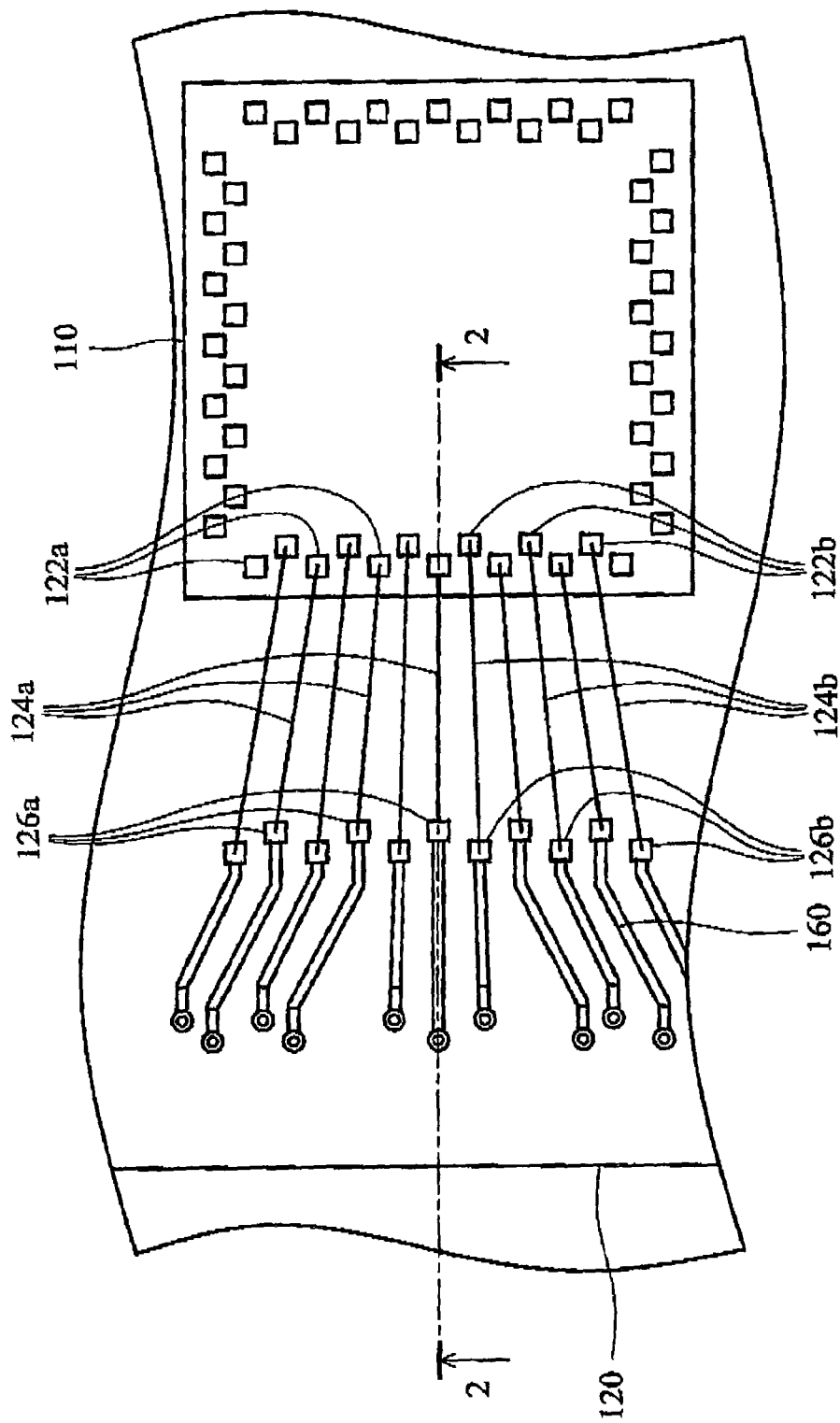
FIG. 1 is a top view of a conventional chip encapsulated by a package body, with staggered bonding pads disposed thereon.
Figure 2:
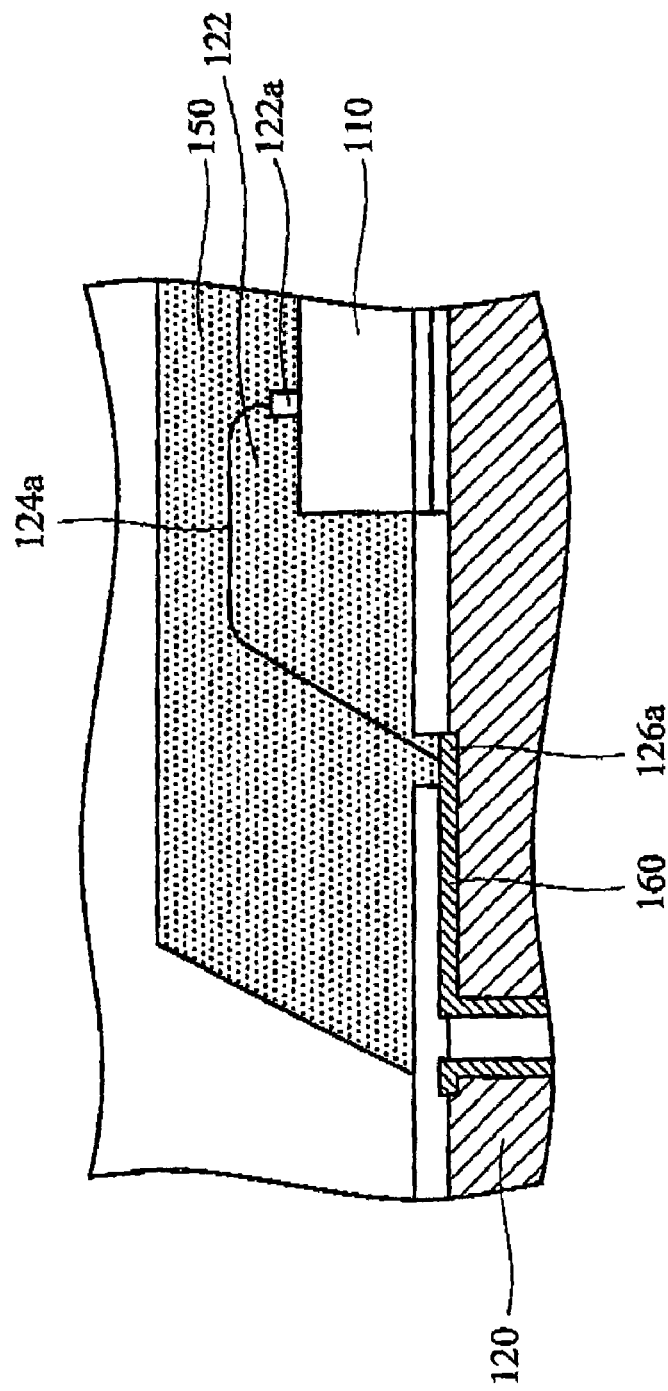
FIG. 2 is a cross-section of FIG. 1 after formation of the package body.
Figure 3:
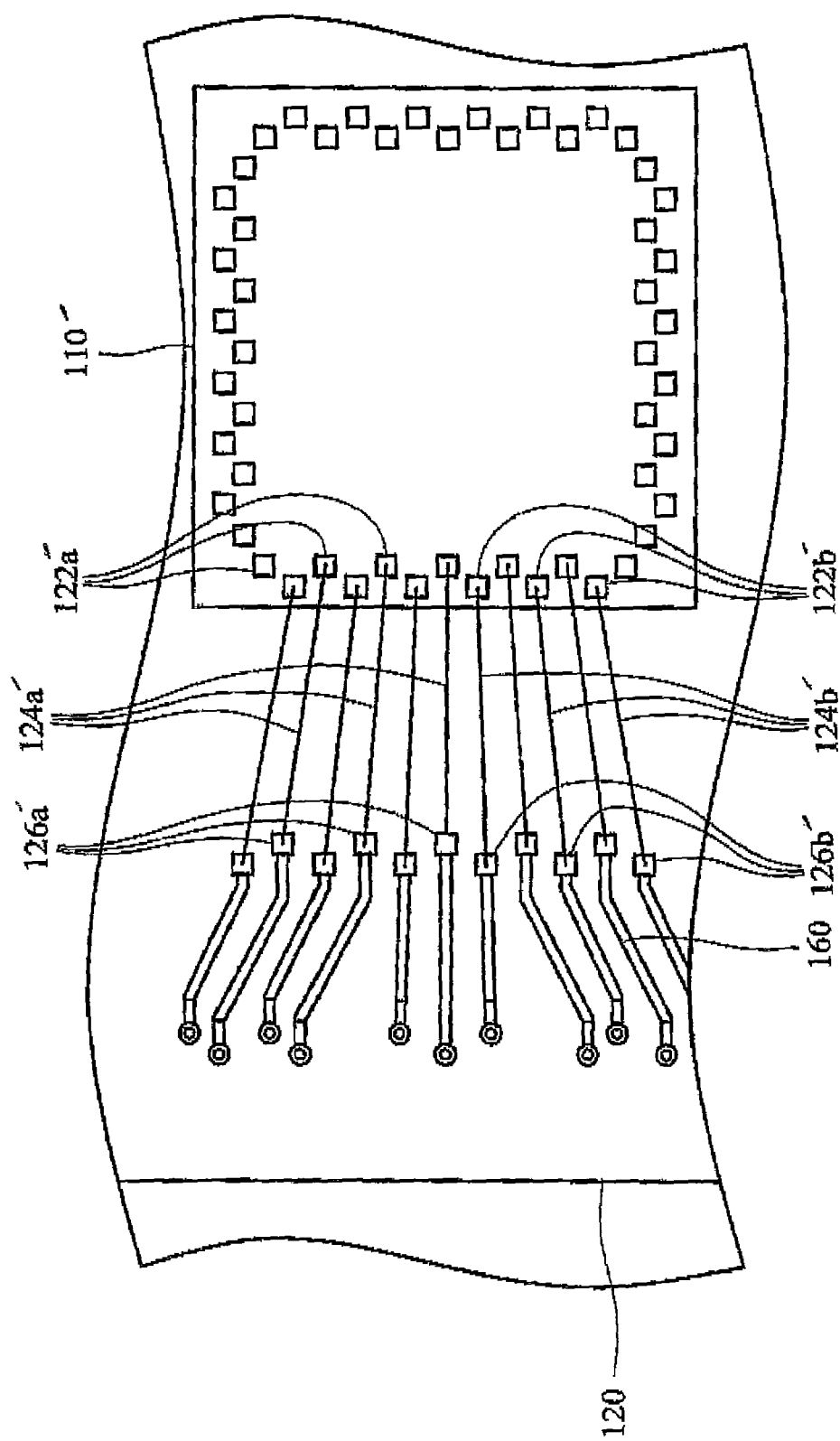
FIG. 3 is a top view of another conventional chip encapsulated by a package body, having staggered bonding pads thereon.
Figure 4:
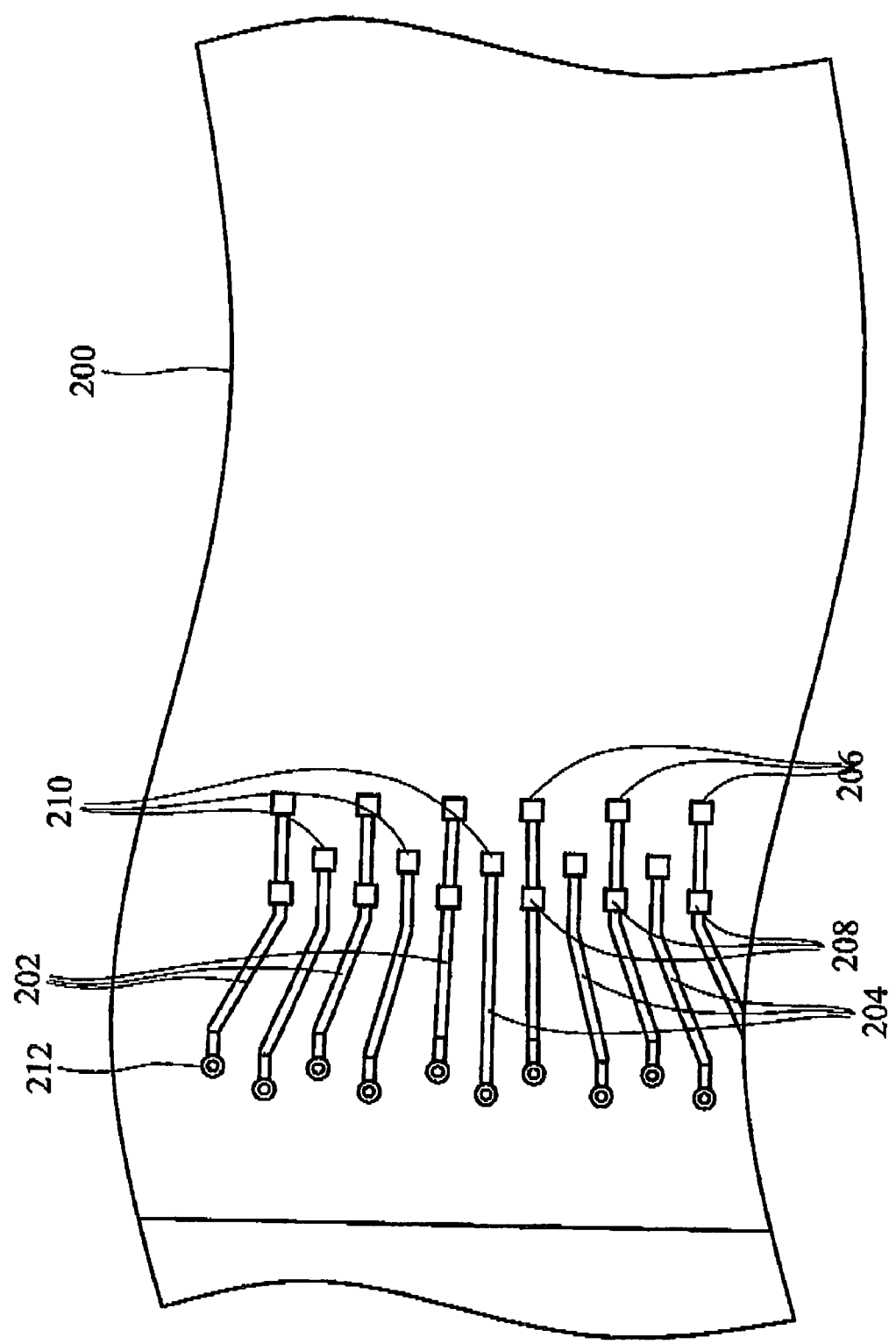
FIG. 4 is a top view of a substrate bearing a staggered finger configuration according to an embodiment of the invention.
Figure 7:
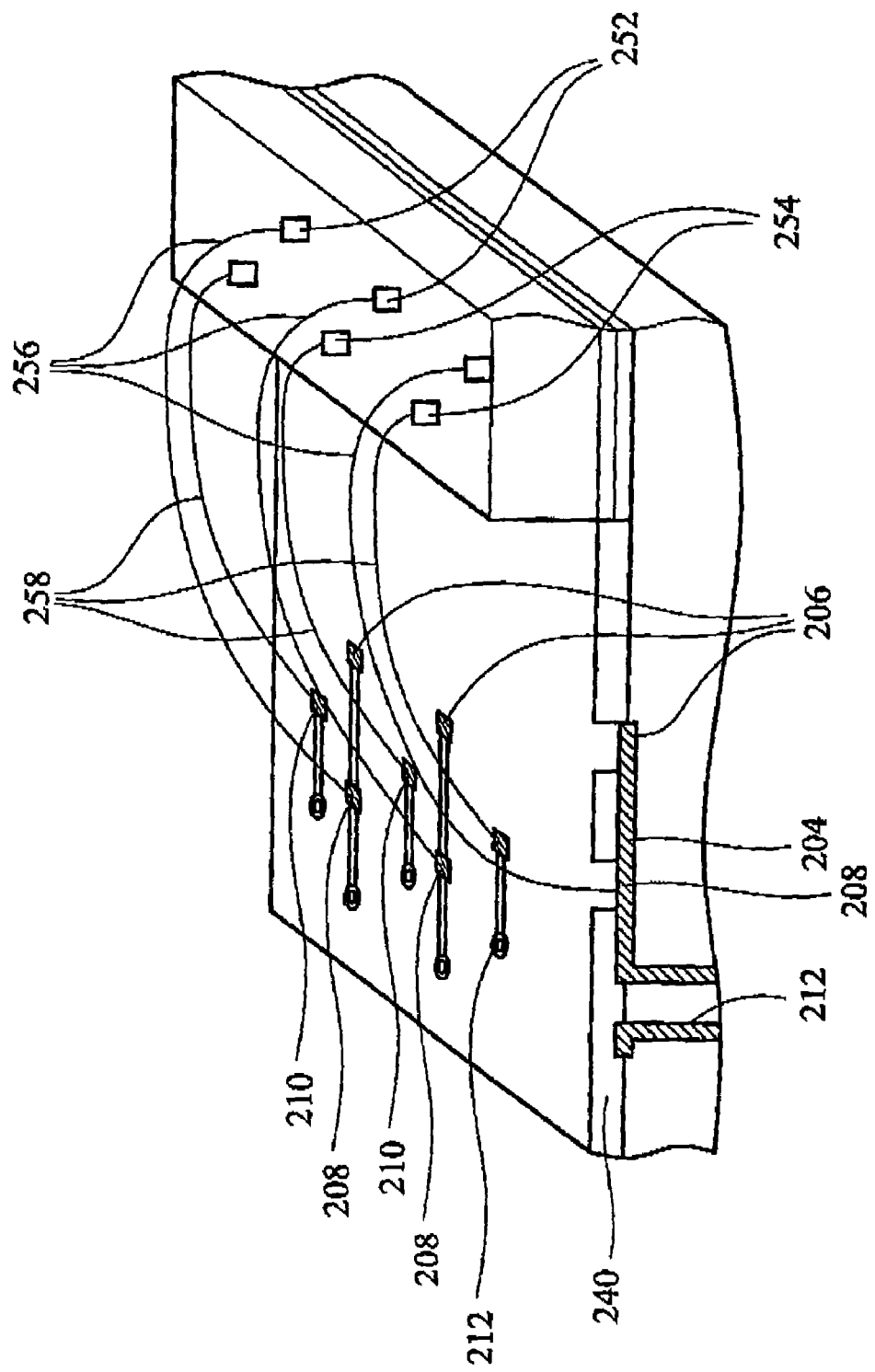
FIG. 7 is a perspective diagram of a semiconductor chip package structure according to an embodiment of the invention.

FIG. 4 is a top view of a substrate bearing a staggered finger configuration according to an embodiment of the invention. In this embodiment, a substrate 200 has a plurality of first and second conductive wires arranged alternately thereon. Each of the first conductive wires connects to a pair of inner and an outer finger 206, 208, and each of the second conductive wires connects to an intermediate finger between the inner and outer fingers 206, 208, providing a staggered finger configuration connecting to signal pads on the chip. The substrate 200 may be a core substrate with vias, blind vias or buried vias. Additionally, the substrate 200 and the first and the second conductive wires 202, 204 further comprise a solder mask 240 30 thereon (as shown in FIG. 7). The fingers 206, 208, and 210 are exposed under openings of the solder mask 240. In this embodiment, the openings may be rectangular or other shape such as square, circular or polygonal.

Again referring to FIG. 4, the first and the second conductive wires comprise Cu, Sn, Ni, Cr, Ti, Cu—Cr alloy or Pb—Sn alloy, and the surface of the fingers 206, 208 and 210 has a anti-oxidized metal film comprising Au, Ni, Pd, Ag, Sn, Ni, Ni—Pd alloy, Cr—Ti alloy, Ni—Au alloy, Pd—Au alloy, Ni—Pd—Au alloy or two combination thereof. The conductive wires 202, 204 la further connect with the via 212, blind via or buried via.

Figure 5:
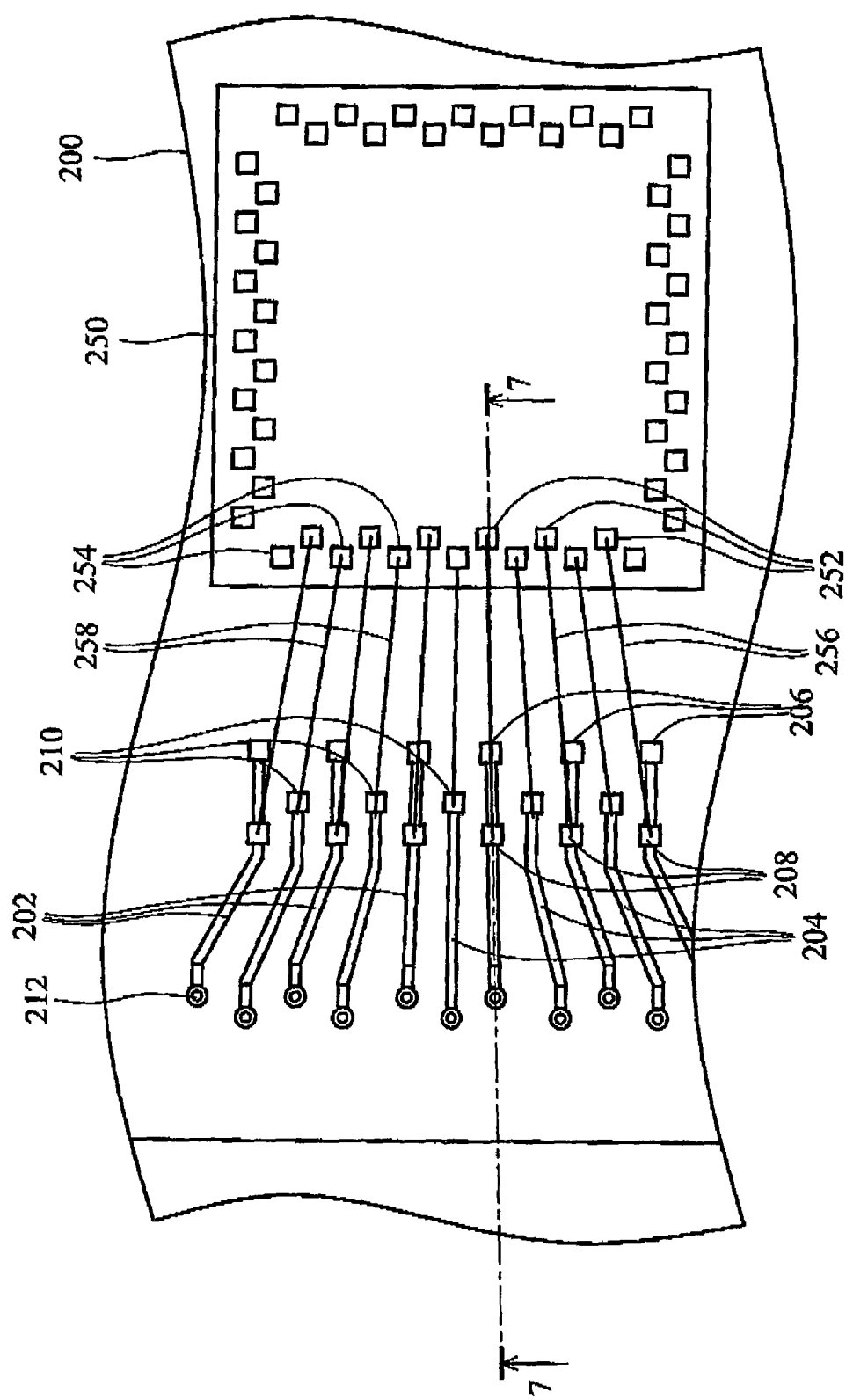
FIG. 5 is a top view of a semiconductor chip and substrate according to an embodiment of the invention.

FIG. 5 is a top view of a semiconductor chip and substrate according to an embodiment of the invention. A substrate 200 is provided and chip 250 is disposed thereon. In this embodiment, the periphery of the chip 250 has rows of inner and outer bonding pads 252, 254 arranged alternately thereon. In addition, the inner, the intermediate and outer fingers 206, 208 and 210 are arranged horizontally on the substrate outside the chip 250, wherein the inner fingers are closer to the chip 210 than other fingers. The substrate 200 and first and second conductive wires 202, 204 further comprise a solder mask 240 (as shown in FIG. 7) thereon, and the fingers 206, 208 and 210 are exposed under openings of the solder mask 240. In this embodiment, the openings may be rectangular, or other shape such as square, circular or polygonal.

Figure 6:
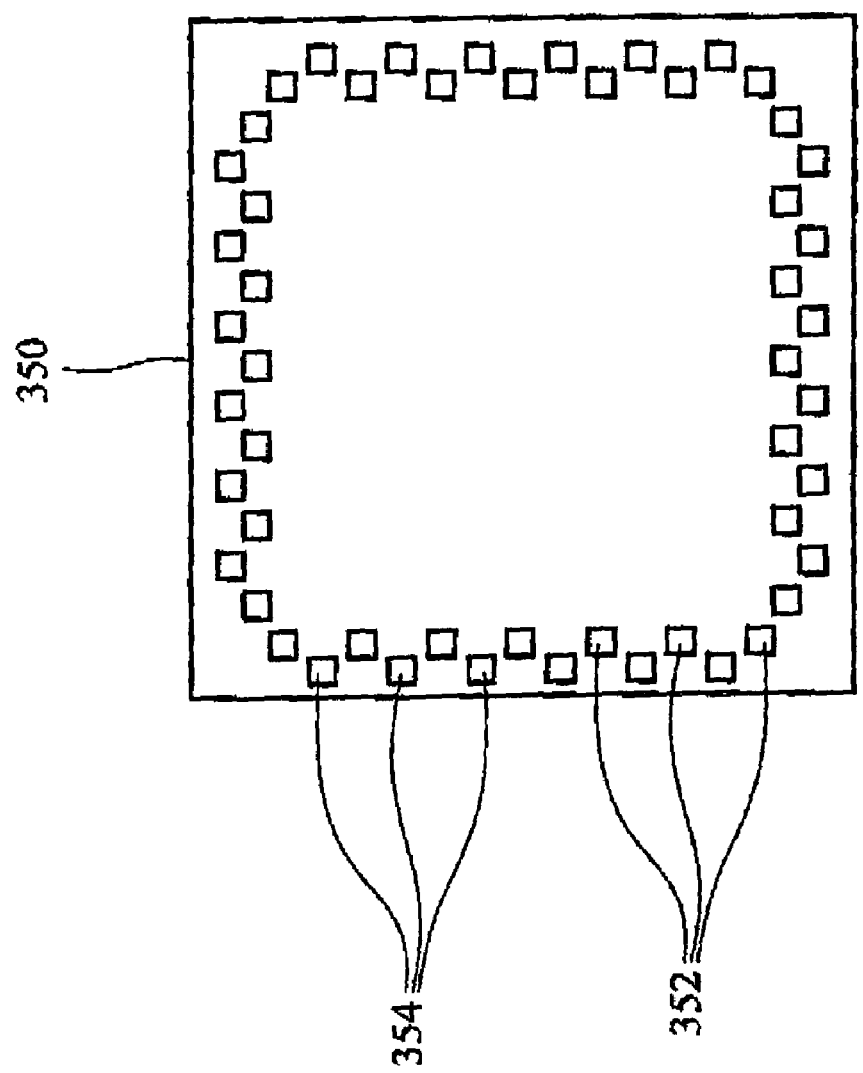
FIG. 6 is the top view of a chip with staggered bonding pads according to another embodiment of the invention.

Still referring to FIG. 5, a plurality of first and second bonding wires 256, 258, arranged alternately with one ends of each connecting to the fingers and the other ends of each connecting to bonding pads by wire bonding process. The first bonding wires 256 connect to a pair of inner and outer fingers 206, 208 on the first conductive wire 202, and the second bonding wires 258 connect the intermediate fingers on the second conductive wires 204. Using the arrangement of the bonding pads on the chip 250 in FIG. 5 as an example, one ends of the first bonding wire 256 connect to the outer fingers 208 on the first conductive wires 202. FIG. 6 illustrates the chip 350 with another arrangement of an inner and outer bonding pad 352, 354, opposite to that in FIG. 5, wherein one ends of the first bonding wire 256 connect to the inner fingers 206 on the first conductive wires 202.

The invention allows only one substrate to be used for different chips with staggered bonding pads, enabling the first and second wires to be tiered to prevent shorts in wire bonding process. FIG. 7 is a perspective diagram of a semiconductor chip package structure according to an embodiment of the invention, wherein each second bonding wire 258 has the same loop height and each first bonding wire 256 has the same loop height. In this embodiment, the first bonding wires 256 have a loop height exceeding that of the second bonding wires due to the connection to the inner bonding pads 352 and outer fingers 208.

Moreover, in the invention, the pitch of the inner and the outer bonding pads exceeds or is equal to the width of the inner and the outer bonding pads respectively, and the pitch of the inner, the intermediate and the outer fingers exceeds or is equal to the width thereof respectively.

Figure 8:
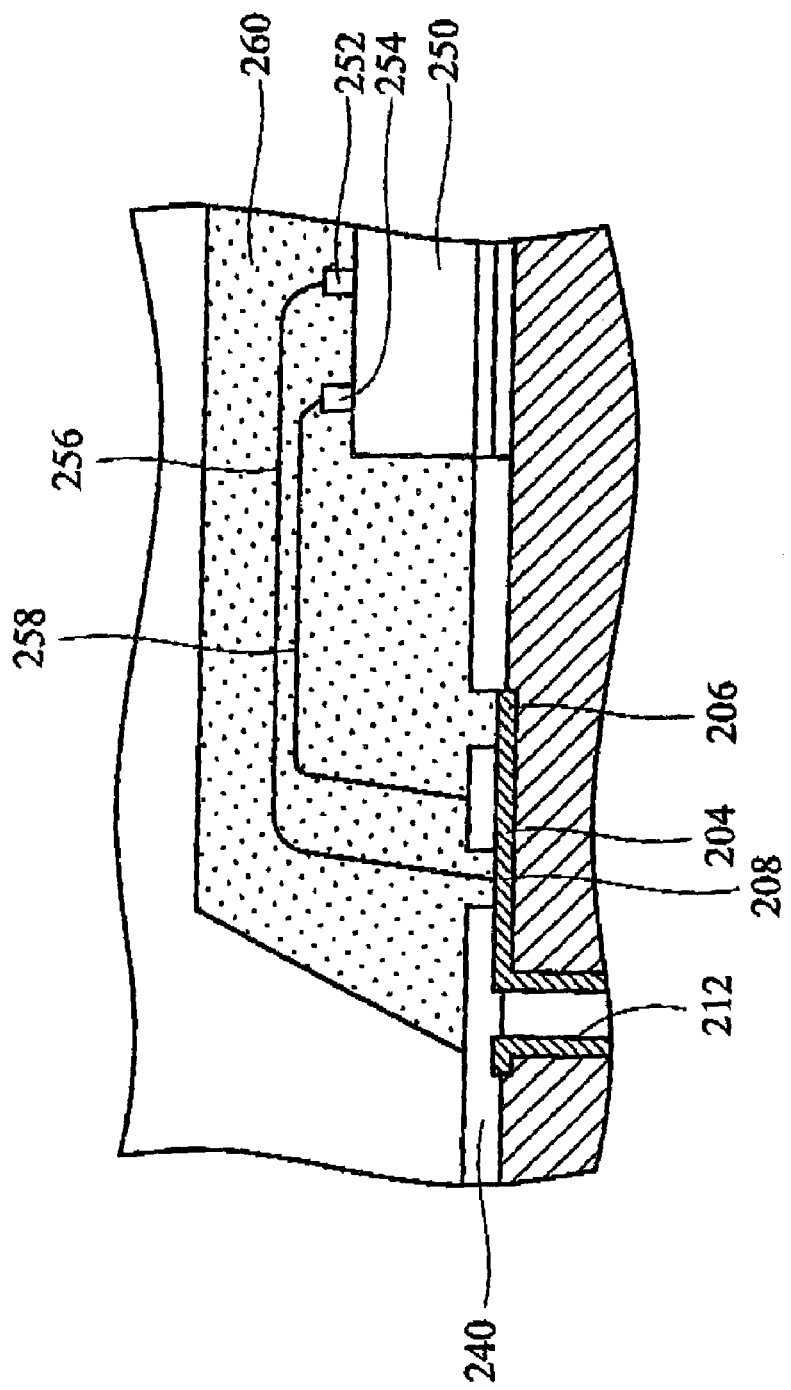
FIG. 8 is a cross-section of a semiconductor chip package structure according to an embodiment of the invention.

FIG. 8 is a cross-section of a semiconductor chip package structure according to an embodiment of the invention. A package material 260 is formed on the architecture shown in FIG. 5 to enclose the chip 250, conductive wires 202 and 204, bonding wires 256 and 258, and the top surface of the substrate 200, wherein one end of the conductive wires 202, 204 may connect with the via 212, blind via or buried via. The package material 260 is a rubber such as epoxy to achieve the staggered finger configuration.

The staggered finger configuration and the semiconductor chip package of the invention provide at least the following three advantages:

1. Only one substrate is needed for all kinds of chip with staggered bonding pads and preventing short in wire bonding process.

2. The conventional chip with single in-line bonding pads can be replaced by the chip with staggered bonding pads of the invention to increase the number of bonding pads on a chip, thus improving the chip efficiency.

3. Only one substrate is needed for all kinds of chip with staggered bonding pads and increasing the number of bonding pad on a chip to reduce the cost of the package for chips, and improve the yield of the package for chips.

Finally, while the invention has been described by way of example and in terms of preferred embodiment, it is to be understood that the invention is not limited thereof. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A substrate for wire bonding, comprising a plurality of first and second conducting wires alternately arranged on a substrate, wherein each of the first conducting wires connects to a pair of inner and outer fingers, each of the second conducting wires connects to an intermediate finger which is located between the inner and the outer fingers, the inner fingers, the intermediate fingers and the outer fingers are located along a first row, a second row and a third row respectively, and the second row is located between the first row and the third row.

2. The substrate of claim 1, further comprising a solder mask on the first and second conducting wires.

3. The substrate of claim 2, wherein the fingers are exposed under openings of the solder mask.

4. The substrate of claim 1, further comprises at least a via, a buried via or a blind via.

5. The substrate of claim 4, wherein the first and second conducting wires further connect the via, the buried via or the blind via.

6. A semiconductor chip package, comprising: a substrate comprising a plurality of first and second conducting wires arranged alternately thereon, wherein each of the first conducting wires connects to a pair of inner and outer fingers, each of the second conducting wires connects to an intermediate finger which is located between the inner and the outer fingers, the inner fingers, the intermediate fingers and the outer fingers are located along a first row, a second row and a third row respectively, and the second row is located between the first row and the third row; a chip disposed on the substrate, having a plurality of bonding pads thereon; a plurality of first and second bonding wires arranged alternately with one ends thereof connecting to the inner, outer or intermediate fingers and the other ends thereof connecting to the bonding pads, wherein the first bonding wires connect to either the inner or the outer fingers, and the second bonding wires connect to the intermediate fingers; and a package material covering the chip, the first and second conducting wires, the first and second bonding wires and an upper surface of the substrate.

7. The semiconductor chip package of claim 6, further comprising a solder mask on the substrate and the first and second conducting wires.

8. The semiconductor chip package of claim 7, wherein the inner, outer and intermediate fingers are exposed under openings of the solder mask.

9. The semiconductor chip package of claim 6, wherein the inner fingers are closer to the chip than the outer fingers.

10. The semiconductor chip package of claim 6, wherein the bonding pads comprise rows of inner and outer bonding pads disposed alternately on the periphery of the chip.

11. The semiconductor chip package of claim 10, wherein the first bonding wires connect the inner fingers and the outer bonding pads and the second bonding wires connect the intermediate fingers and the inner bonding pads.

12. The semiconductor chip package of claim 10, wherein the first bonding wires connect the outer fingers and the inner bonding pads, and the second bonding wires connect, the intermediate fingers and the outer bonding pads on the chip.

13. The semiconductor chip package of claim 6, wherein the first bonding wires and the second bonding wires are tiered.

14. The semiconductor chip package of claim 6, wherein the second bonding wires have the same loop height.

15. The semiconductor chip package of claim 6, wherein the first bonding wires have the same loop height.

16. The semiconductor chip package of claim 12, wherein the first bonding wires have a lower loop than the second bonding wires.

17. The semiconductor chip package of claim 12, wherein the first bonding wires have a higher loop than the second bonding wires.

18. The semiconductor chip package of claim 10, wherein the pitch of the inner bonding pads exceeds or is equal to the width thereof.

19. The semiconductor chip package of claim 10, wherein the pitch of the outer bonding pads exceeds or is equal to the width thereof.

20. The semiconductor chip package of claim 6, wherein the pitch of the inner, intermediate or outer fingers exceeds or is equal to the width thereof.

* * * * *